(12) United States Patent
Schuster

(10) Patent No.: US 8,465,905 B2
(45) Date of Patent: Jun. 18, 2013

(54) PRINTING CONDUCTIVE LINES

(75) Inventor: Israel Schuster, Petach Tikva (IL)

(73) Assignee: Eastman Kodak Company, Rochester, NY (US)

( * ) Notice: Subject to any disclaimer, the term of this patent is extended or adjusted under 35 U.S.C. 154(b) by 87 days.

(21) Appl. No.: 13/079,150

(22) Filed: Apr. 4, 2011

(65) Prior Publication Data

US 2012/0249660 A1  Oct. 4, 2012

(51) Int. Cl.
*G03F 7/26* (2006.01)
(52) U.S. Cl.
USPC .......................................... 430/311; 430/320
(58) Field of Classification Search
CPC .................... H01B 1/16; H05K 3/105
USPC ............... 347/20, 54, 55, 110–112; 430/311, 430/320
See application file for complete search history.

(56) References Cited

U.S. PATENT DOCUMENTS

| 4,910,118 | A | * | 3/1990 | Adair et al. ................. 430/138 |
| 5,132,248 | A | | 7/1992 | Drummond et al. |
| 6,348,295 | B1 | | 2/2002 | Griffith et al. |
| 7,087,523 | B2 | | 8/2006 | Grigoropoulos et al. |
| 7,569,331 | B2 | * | 8/2009 | Dorogy et al. ................. 430/311 |
| 2005/0276933 | A1 | | 12/2005 | Prasad et al. |

FOREIGN PATENT DOCUMENTS

WO  2009/044219  4/2009

* cited by examiner

*Primary Examiner* — An Do
(74) *Attorney, Agent, or Firm* — Nelson Adrian Blish

(57) ABSTRACT

An apparatus (300) for printing conductive lines on a substrate includes a printing element (320) for printing a pattern of conductive material (204) on the substrate; and an imaging element (324) configured to sinter a first part of the pattern of conductive material.

8 Claims, 6 Drawing Sheets

PRINTING CONDUCTIVE LINES

CROSS REFERENCE TO RELATED APPLICATIONS

Reference is made to commonly-assigned copending U.S. patent application Ser. No. 13/079,177, filed Apr. 4, 2011, entitled PRINTING CONDUCTIVE LINES, by Schuster; the disclosure of which is incorporated herein.

FIELD OF THE INVENTION

The present invention relates to writing conductive lines and conductive grids on media, and in particular to writing with an inkjet and laser combination.

BACKGROUND OF THE INVENTION

One of the ultimate goals in electronics is the ability to directly write electronic components and circuits on a variety of substrates. Advancing materials chemistry and developing printhead technology is bringing this goal closer to reality.

Drop on demand inkjet printing applied to industrial processes, utilizes the piezo electric effect to deliver precise and consistent quantities of fluids to media or substrate. Such inkjet printing has a relatively low resolution, which might not be enough to print the fine details in circuit boards 100 as shown in FIG. 1.

Current methods for printing electronics on suitable substrates, for example applying material deposition, results in relatively thick lines, i.e. greater than 30 micrometers. Other methods, such as subtractive methods, which may be based upon laser writing and etching, may consume large amounts of expensive conductive material. FIG. 2 shows conductive grid lines 204 deposited by known printing methods such as inkjet deposition of conductive material on substrate 208.

The deposition of the conductive grid lines may also be done by flexographical means. The width of the grid lines formed depends on the printing method, but in general are not narrow enough to be used for high density circuit boards.

SUMMARY OF THE INVENTION

Briefly, according to one aspect of the present invention an apparatus for printing conductive lines on a substrate includes a printing element for printing a pattern of conductive material on the substrate; and an imaging element configured to sinter a first part of the pattern of conductive material.

These and other objects, features, and advantages of the present invention will become apparent to those skilled in the art upon a reading of the following detailed description when taken in conjunction with the drawings wherein there is shown and described an illustrative embodiment of the invention.

DETAILED DESCRIPTION OF THE INVENTION

In the following detailed description, numerous specific details are set forth in order to provide a thorough understanding of the disclosure. However, it will be understood by those skilled in the art that the teachings of the present disclosure may be practiced without these specific details. In other instances, well-known methods, procedures, components and circuits have not been described in detail so as not to obscure the teachings of the present disclosure.

While the present invention is described in connection with one of the embodiments, it will be understood that it is not intended to limit the invention to this embodiment. On the contrary, it is intended to cover all alternatives, modifications and equivalents as covered by the appended claims.

Figure 1:
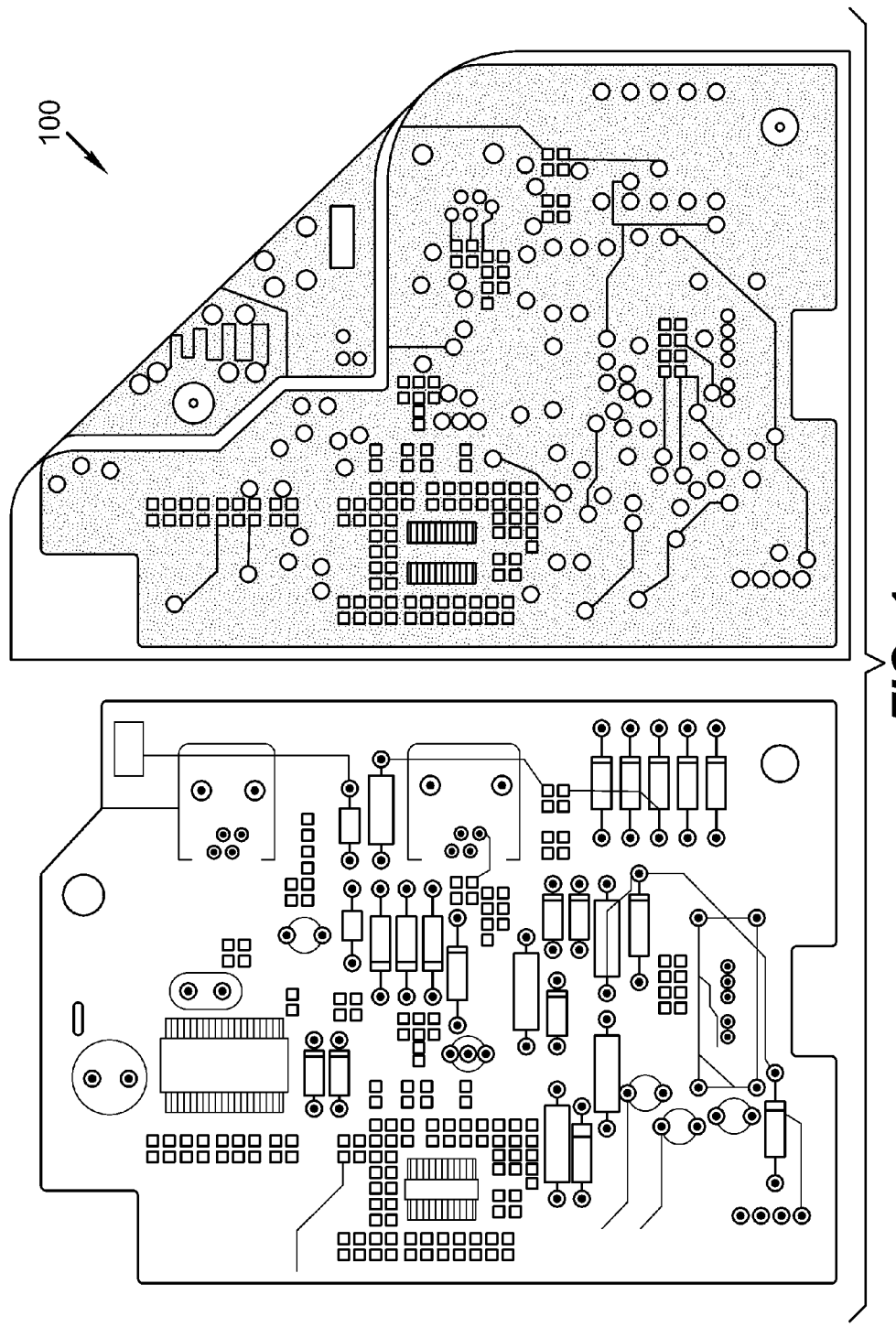
FIG. 1 shows a prior art diagrammatic form of a printed circuit board.
Figure 2:
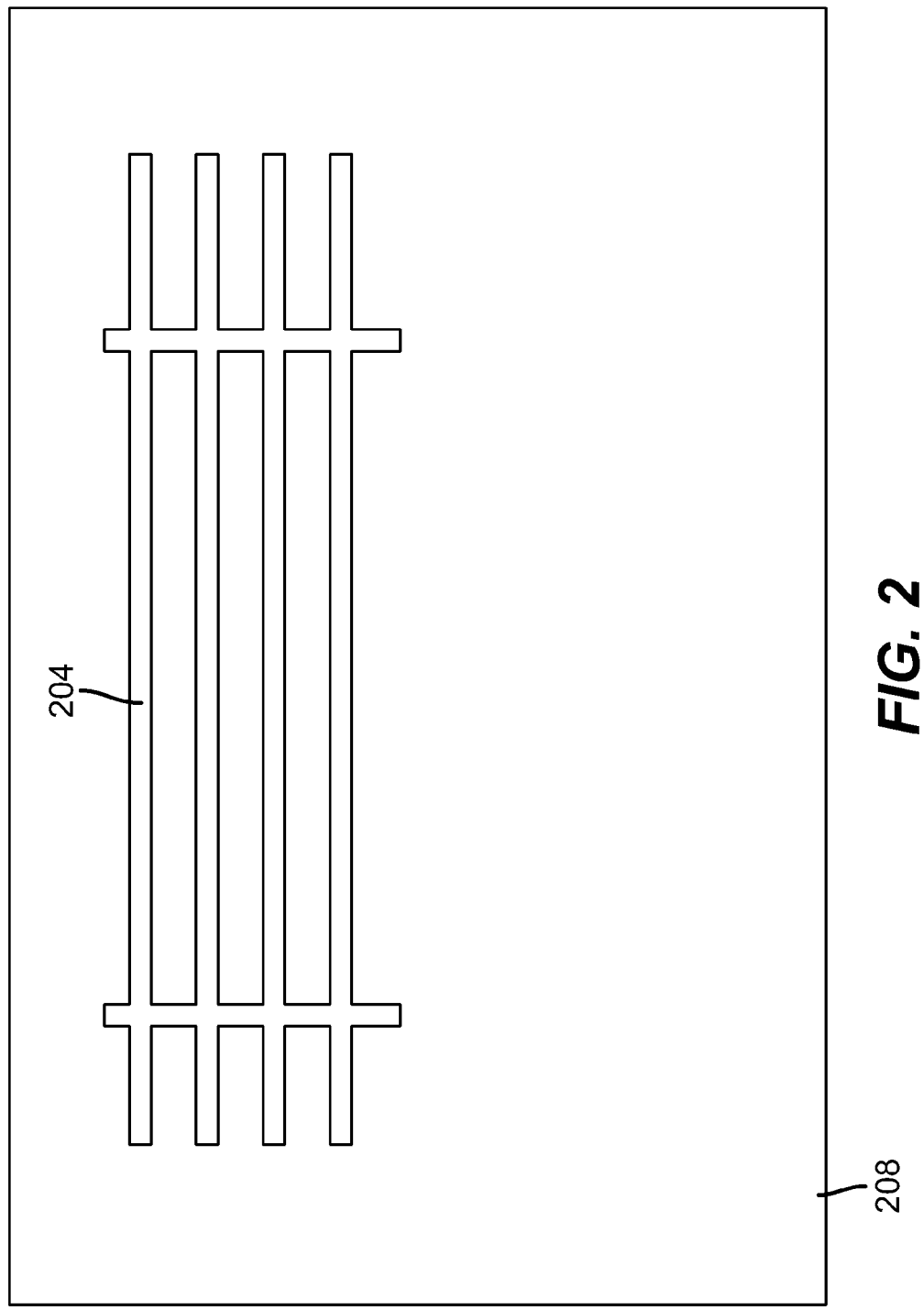
FIG. 2 represents in diagrammatic form a prior art imaging device adapted to form conductive lines using inkjet head and laser imaging head.
Figure 3:
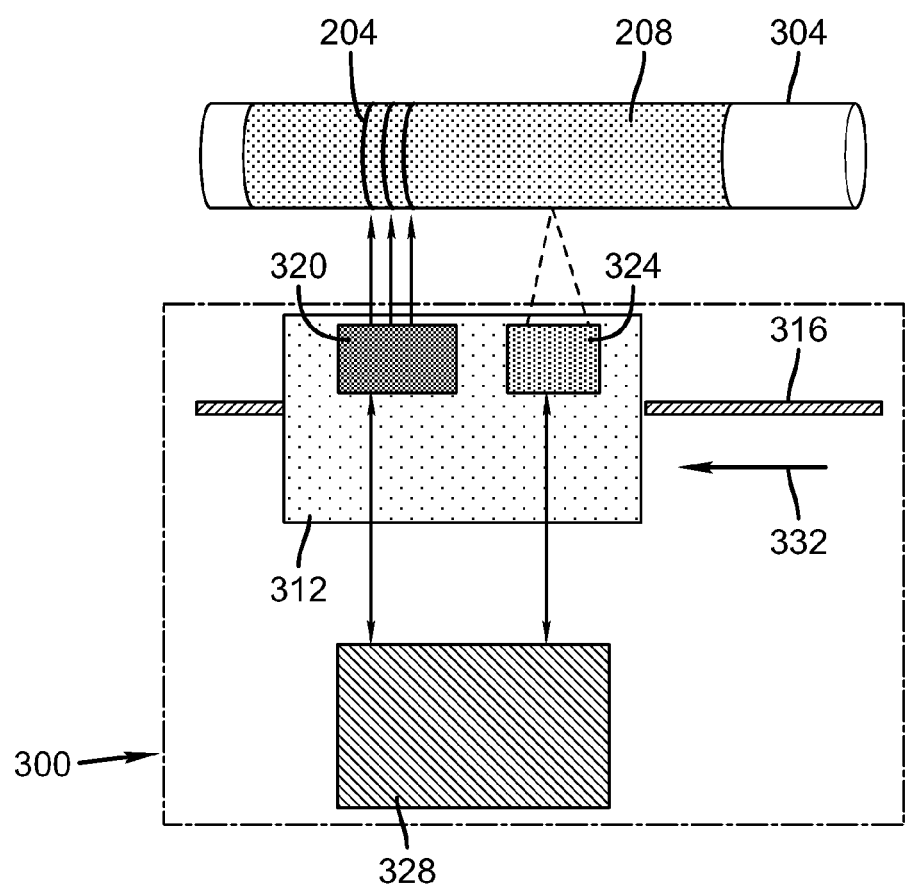
FIG. 3 represents in diagrammatic form an imaging head for forming conductive lines.
Figure 4:
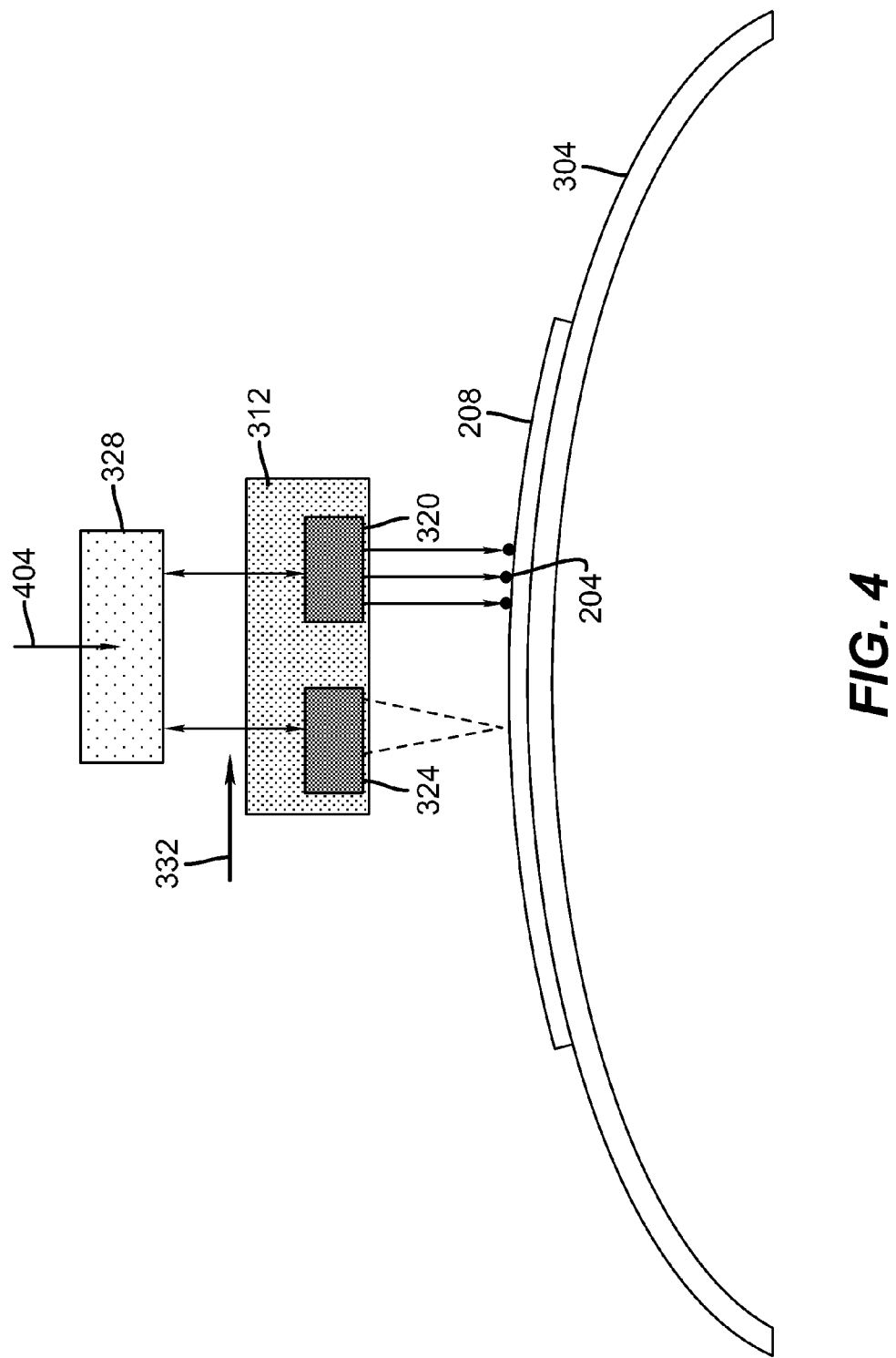
FIG. 4 represents in diagrammatic form conductive lines formed with inkjet means.

FIG. 3 shows an arrangement of an imaging device 300 configured to image conductive material on substrate 208. The substrate 208 in this arrangement is mounted on a rotating cylinder 304. The imaging device 300 contains a carriage 312. The carriage is adapted to move substantially in parallel to cylinder 304 guided by an advancement screw 316. An inkjet imaging head 320 is mounted on carriage 312, along with a laser source 324. The inkjet imaging head 320 is positioned on carriage 312 in such a manner that during scanning of carriage 312 (in direction 332), it precedes the laser source 324. Controller 328 coordinates and synchronizes the operation of inkjet head 320 and laser source 324. Controller 328 receives the data for imaging 404 (in FIG. 4) from a digital front end (not shown) and provides it to the inkjet head 320 and laser source 324. The inkjet head 320 deposits conductive lines 204 on substrate 208.

Following the deposition of the conductive lines 204 deposition, by inkjet head 320, a focused laser beam is applied by laser source 324. The thickness of sintering applied by the laser source 324 is variable and is adjusted by the spot size of the laser source 324. The laser source 324 scans lines 204 on the previously deposited lines 204.

Figure 5:
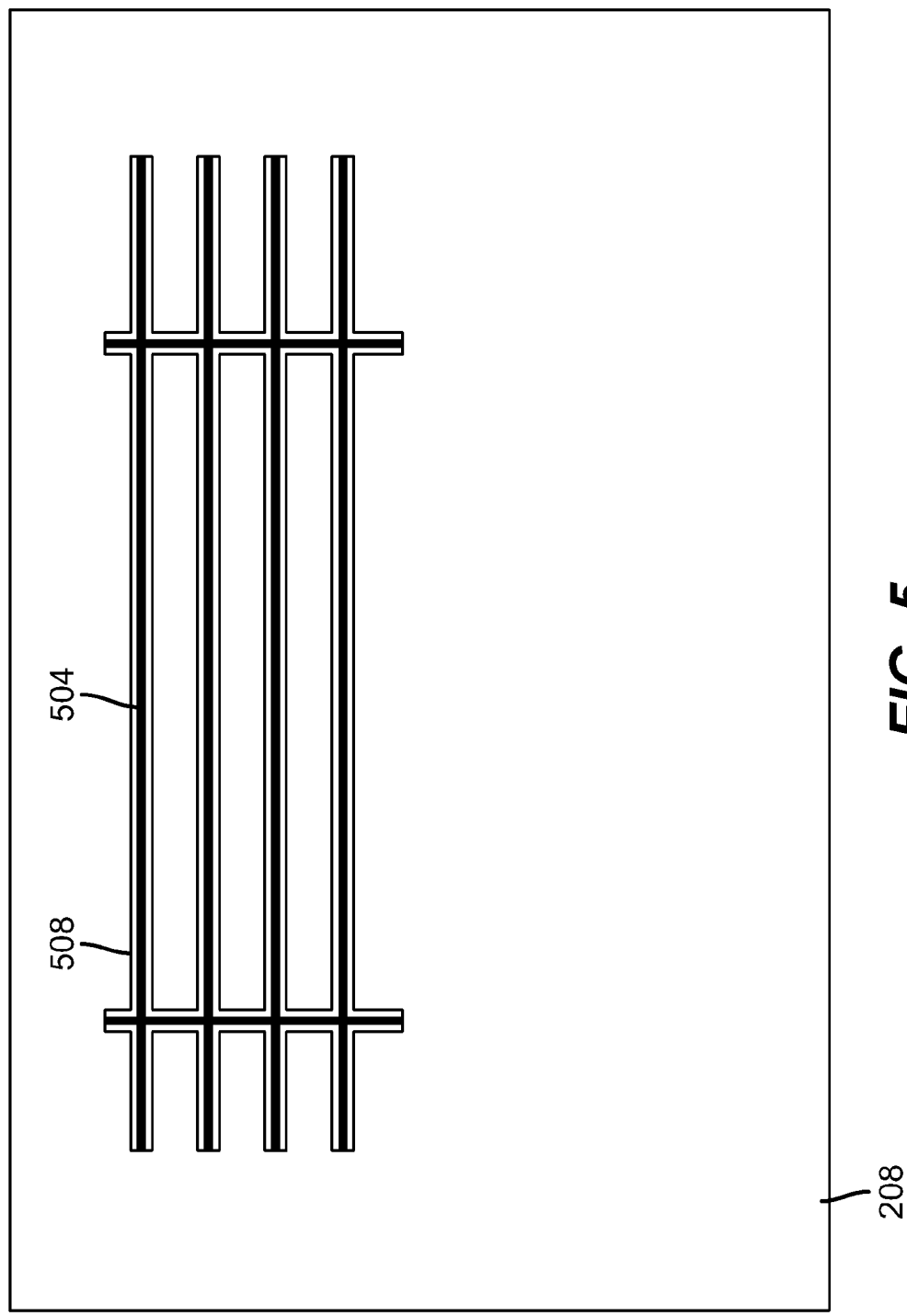
FIG. 5 represents in diagrammatic form sintered conductive lines previously imaged by inkjet means.

This process (the laser imaging on lines 204) sinters together the nano-particles of the ink deposited on lines 204. Since size of the laser spot can be made significantly smaller than the deposited line, the sintering process can form sintered grid lines 504 shown in FIG. 5, which are substantially narrower that lines 204. After the laser imaging a sintered metallic conductive line 504 is formed surrounded with un-sintered ink 508.

The un-sintered ink 508 is then removed with appropriate materials and complementary processes such as brushing with water (not shown). Alternatively an un-sintered removal element (not shown) can be added to imaging device 300 on carriage 312. The removal element will operate following to the laser source for sintering 324 on the un-sintered ink 508.

Figure 6:
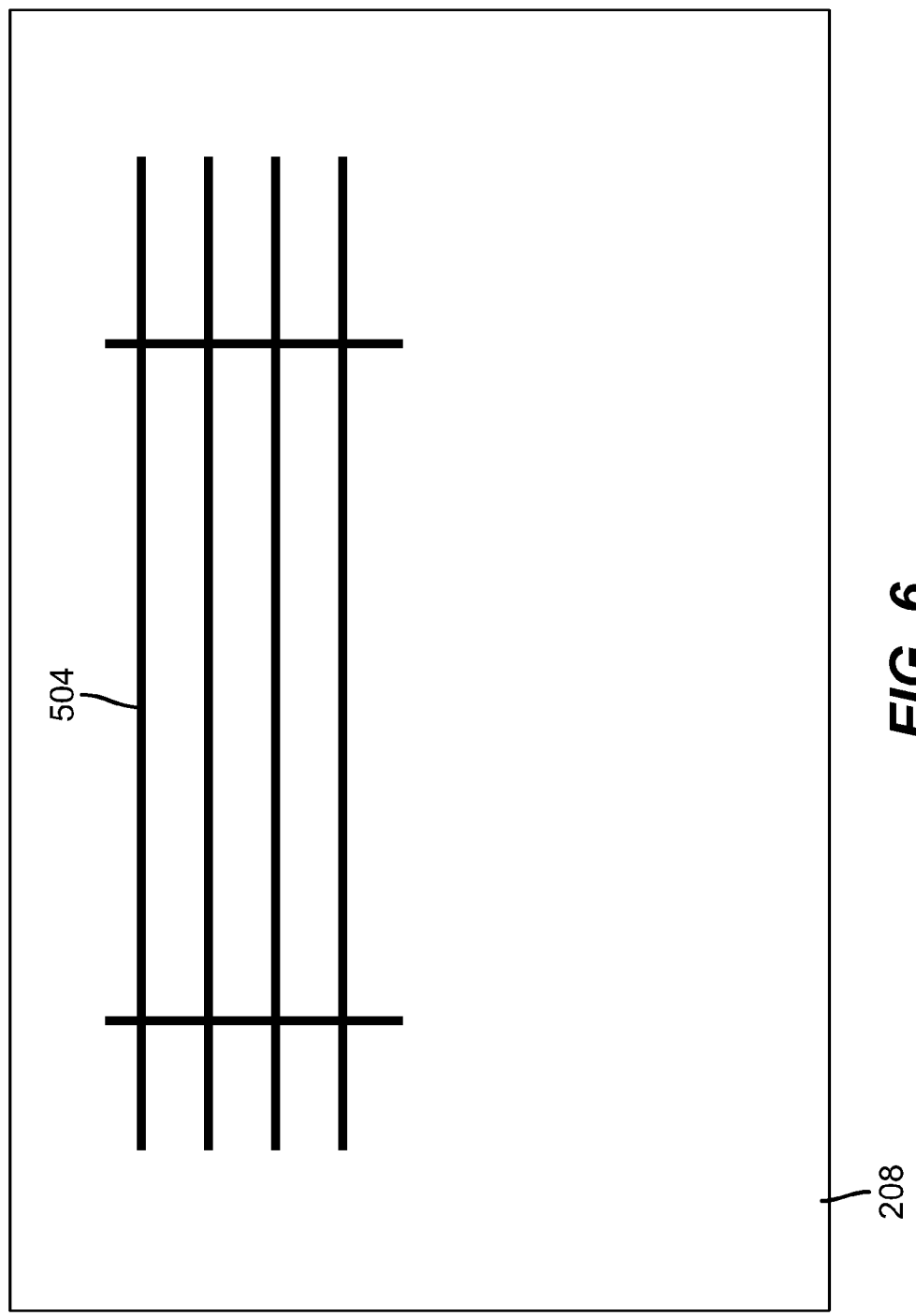
FIG. 6 represents in diagrammatic form of sintered conductive lines after removing the non sintered inkjet material.

The result of the process using the device described above as is shown in FIG. 6, is a sintered metallic line 504 in the width of the focused laser beam and enhanced conductivity due to the nature of the sintering process.

The invention has been described in detail with particular reference to certain preferred embodiments thereof, but it will be understood that variations and modifications can be effected within the scope of the invention.

Parts List 100 printed circuit electronic board
204 inkjet formed conductive lines

208 substrate
300 imaging device
304 rotating cylinder
312 carriage
316 screw
320 inkjet imaging head
324 laser source for sintering
328 controller
332 carriage direction
404 imaging data
504 sintered conductive lines
508 conductive deposited material to be washed out

The invention claimed is:

1. An apparatus for printing conductive lines on a substrate comprising:
   a printing element for printing a pattern of conductive lines of nano-particles on the substrate;
   an imaging element that sinters a first portion of nano-particle lines;
   a carriage that transports the printing element and the imaging element relative to the substrate; and
   wherein the printing element precedes the imaging element in a direction of travel of the carriage.

2. The apparatus of claim 1 further comprising:
   a third element for removing a second part of the pattern of conductive material.

3. The apparatus of claim 2 wherein the third element removes the second part of the pattern of conductive material by washing.

4. The apparatus according to claim 2 wherein the third element is not integrated in the apparatus.

5. The apparatus according to claim 2 wherein the third element is integrated in the apparatus.

6. The apparatus of claim 1 wherein the imaging element is a laser.

7. The apparatus according to claim 6 wherein the laser imaging element sinters lines of variable thickness.

8. The apparatus of claim 1 wherein the printing element is an inkjet printhead.

* * * * *